(12) United States Patent
Wu et al.

(10) Patent No.: US 11,750,949 B2
(45) Date of Patent: Sep. 5, 2023

(54) REFERENCE CLOCK COMPLEMENTARY METAL-OXIDE SEMICONDUCTOR (CMOS) INPUT BUFFER WITH SELF-CALIBRATION AND IMPROVED ELECTROSTATIC DISCHARGE (ESP) PERFORMANCE

(71) Applicant: OMNIVISION TECHNOLOGIES, INC., Santa Clara, CA (US)

(72) Inventors: Charles Qingle Wu, Palo Alto, CA (US); Yanying He, San Jose, CA (US); Weiyi Zhang, Shanghai (CN)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 237 days.

(21) Appl. No.: 17/465,184

(22) Filed: Sep. 2, 2021

(65) Prior Publication Data

US 2023/0062619 A1    Mar. 2, 2023

(51) Int. Cl.
*H04N 25/71*    (2023.01)
*H03L 7/08*    (2006.01)
*H01L 27/02*    (2006.01)
*H04N 25/772*    (2023.01)

(52) U.S. Cl.
CPC ....... *H04N 25/745* (2023.01); *H01L 27/0251* (2013.01); *H03L 7/08* (2013.01); *H04N 25/772* (2023.01)

(58) Field of Classification Search
CPC .. H04N 25/745; H04N 25/772; H04N 5/3765; H04N 5/3355; H04N 25/7795; H01L 27/025; H03L 7/08
See application file for complete search history.

(56) References Cited

U.S. PATENT DOCUMENTS 4,345,187 A * 8/1982 Casper, Jr. ............. H04N 5/126
                                                      315/408

* cited by examiner

*Primary Examiner* — Nicholas G Giles
(74) *Attorney, Agent, or Firm* — Christensen O'Connor Johnson Kindness PLLC

(57) ABSTRACT

Reference clock CMOS input buffer with self-calibration and improved ESD performance. In one embodiment, a reference clock input buffer of an image sensor includes a Schmitt trigger configured to generate a clock signal having a falling edge and a rising edge. The falling edge and the rising edge are separated by a hysteresis voltage. The Schmitt trigger includes a plurality of output switches and a plurality of voltage control switches that are individually coupled to individual output switches [M2-i] of the plurality of output switches. Voltage of the falling edge signal or the rising edge signal of the Schmitt trigger is adjustable by selectively switching at least one voltage control switch of the plurality of voltage control switches.

20 Claims, 12 Drawing Sheets

REFERENCE CLOCK COMPLEMENTARY METAL-OXIDE SEMICONDUCTOR (CMOS) INPUT BUFFER WITH SELF-CALIBRATION AND IMPROVED ELECTROSTATIC DISCHARGE (ESP) PERFORMANCE

BACKGROUND INFORMATION

Field of the Disclosure

This disclosure relates generally to operation of image sensors, and in particular, relates to improved performance of reference clock input buffers.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

Image sensor pixels generate electrical signals that are acquired based on timing provided by reference clock signals. In some embodiments, reference clock pulses are generated by input buffers that are based on complementary metal-oxide semiconductor (CMOS) transistor circuits. However, electrical signals can develop ripples or slope changes while propagating from the image sensor pixels though relatively long printed circuit board (PCB) traces or through flex cables having impedance mismatch. Signal ripples and slope changes in turn make it difficult to select suitable thresholds that define boundaries between the clock high and clock low states. Therefore, systems and methods are needed for improved threshold determination of the reference clock signals.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
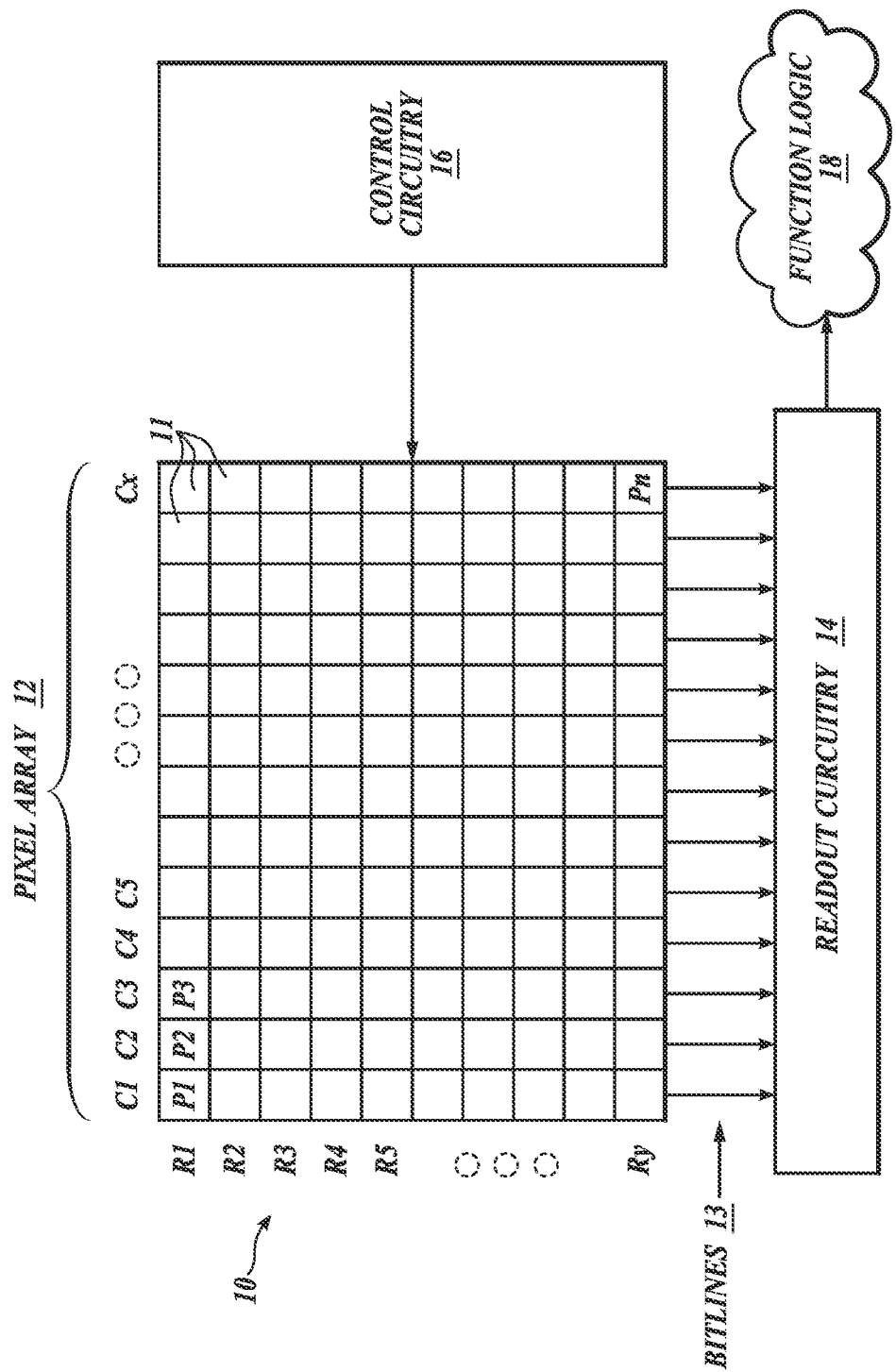
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors that include a reference clock CMOS input buffer with self-calibration and improved electrostatic discharge (ESD) performance are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means+/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to controlling the rising and/or falling edges of clock buffers to avoid voltage ripples in signals generated by optical sensors. In some embodiments, the clock buffer is based on a Schmitt trigger design. Typically, the rising and falling edges are separated by a certain amount of hysteresis such that the rising edge occurs at one voltage Vih and the falling edge occurs at another voltage Vil. When the rising and/or falling edge of the clock buffer coincides with the voltage ripple in the signal, the input clock exhibits increased jitter, which in turn impacts image sensors link timing budget for the entire serializer/deserializer path (also referred to as a "serdes" timing budget).

In some embodiments, the Schmitt trigger clock buffer may include multiple transistors having different sizes, for example different length L and/or width W. In operation, one or more transistors may be selected (e.g., through another, serially connected transistor) to operate or not operate within the Schmitt trigger. When the selectable transistors have different sizes, the output Vih (and/or Vil) change as a function of the selected transistor's size. As a result, zones of voltage ripples may be avoided by an appropriate selection of transistors. As an additional benefit, the ESD protection of the circuit may be improved by adding the serially connected transistor.

In some embodiments, the input voltage of Schmitt trigger may be varied to control a statistical spread of the Vih and/or Vil values. For example, input voltage values to a Schmitt trigger may range from Vref_low as a lower boundary to Vref_high as an upper boundary. Once the Vref_low and Vref_high are established on a "Replica" Schmitt trigger (i.e., a test Schmitt trigger), the supply voltage Vin to a "Master" Schmitt trigger (i.e., an operational Schmitt trigger) can also be kept within these values. In some embodiments, the Replica and Master Schmitt triggers may be the same circuit, however used first as a Replica during calibration, and subsequently used as a Master in normal operation. In some embodiments, the input voltage variation from Vref_low to Vref_high may be generated by a state machine, and provided as Vin to the Schmitt trigger.

FIG. 1 is a diagram of an example image sensor 10 in accordance with an embodiment of the present technology. The image sensor 10 includes a pixel array 12, a control circuitry 16, a readout circuitry 14 and a function logic 18. In one example, the pixel array 12 is a two-dimensional (2D) array of image sensor pixels 11 (e.g., pixels P1, P2 . . . , Pn). Each of image sensor pixel 11 includes a large photodiode (LPD) for low light detection and a small photodiode (SPD) for bright light detection. In different embodiments, two or more image sensor pixels 11 may be grouped into a plurality of pixel cells. As illustrated, the image sensor pixels 11 are arranged into rows (e.g., rows R1 to Ry) and columns (e.g., columns Cl to Cx). In operation, the image sensor pixels 11s acquire image data of a scene, which can then be used to render a 2D image of person, place, object, etc. However, in other embodiments the image sensor pixels 11 may be arranged into configurations other than rows and columns.

In an embodiment, after each image sensor pixel 11 in the pixel array 12 acquires its image charge, the image data is read out by the readout circuitry 14 via bitlines 13, and then transferred to a function logic 18. The readout image data of each image sensor pixel 11 collectively constitute an image frame. In various embodiments, the readout circuitry 14 may include signal amplifiers, analog-to-digital (ADC) conversion circuitry and data transmission circuitry. The function logic 18 may store the image data or even manipulate the image data by applying post image effects (e.g., crop, rotate, remove red eye, adjust brightness, adjust contrast, or otherwise). In some embodiments, the control circuitry 16 and function logic 18 may be combined into a single functional block to control the capture of images by the image sensor pixels 11 and the readout of image data from the readout circuitry 14. The function logic 18 may include a digital processor. In an embodiment, the readout circuitry 14 may read one row of image data at a time along readout column lines (bitlines 13) or may read the image data using a variety of other techniques, such as a serial readout or a full parallel readout of all pixels simultaneously.

In one embodiment, the control circuitry 16 is coupled to the pixel array 12 to control operation of the plurality of photodiodes in the pixel array 12. For example, the control circuitry 16 may generate a shutter signal for controlling image acquisition. In one embodiment, the shutter signal is a global shutter signal for simultaneously enabling all pixels within the pixel array 12 to simultaneously capture their respective image data during a single data acquisition window. In another embodiment, the shutter signal is a rolling shutter signal such that each row, column or group of pixels is sequentially enabled during consecutive acquisition windows. In another embodiment, image acquisition is synchronized with lighting effects such as a flash. In different embodiments, the control circuitry 16 may be configured to control each of image sensor pixels 11 to perform the acquiring operations of one or more dark current pixel frames for image calibration and normal image frames.

In one embodiment, readout circuitry 14 includes analog-to-digital converters (ADCs), which convert analog image data received from the pixel array 12 into a digital representation. The digital representation of the image data may be provided to the function logic 18.

In different embodiments, image sensor 10 may be part of a digital camera, cell phone, laptop computer, or the like. In embodiments, image sensor 10 is incorporated as part of surveillance system or vision system for automobile. Additionally, image sensor 10 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to the image sensor 10, extract image data from the image sensor 10, or manipulate image data supplied by image sensor 10.

Figure 2:
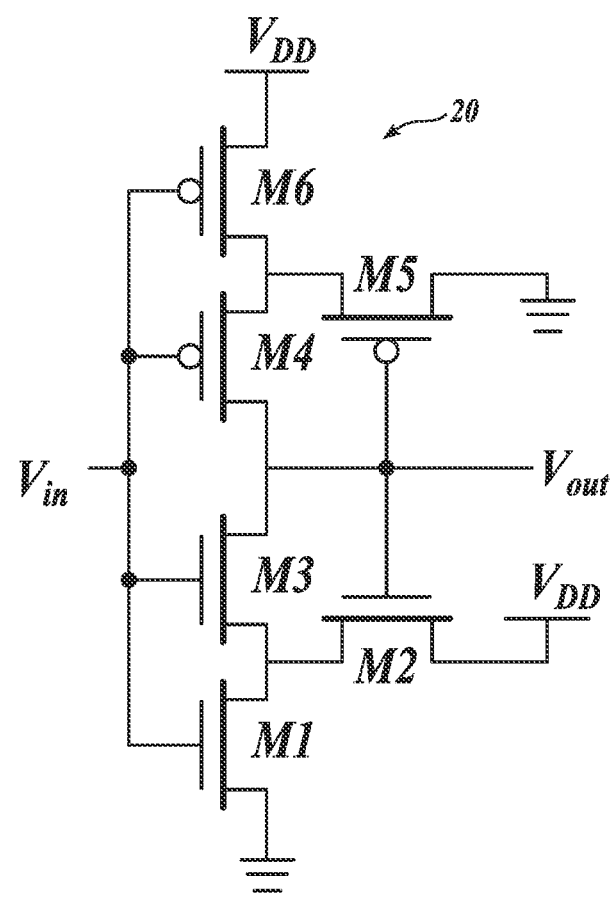
FIG. 2 is a schematic diagram of a reference clock input buffer in accordance with embodiments of the present technology.

FIG. 2 is a schematic diagram of a reference clock input buffer in accordance with embodiments of the present technology. The illustrated reference clock input buffer 20 is a Schmitt trigger. Output voltage Vout depends on input voltage Vin, power supply voltage VDD and characteristics of the transistors (switches) M1-M6. In the context of this specification, transistors (switches) M2 and M5 are referred to as the output transistors (switches). In operation, the Schmitt trigger 20 generates an output Vout that is characterized by a hysteresis. An example of such hysteresis is discussed below with reference to FIG. 3A.

Figure 3B:
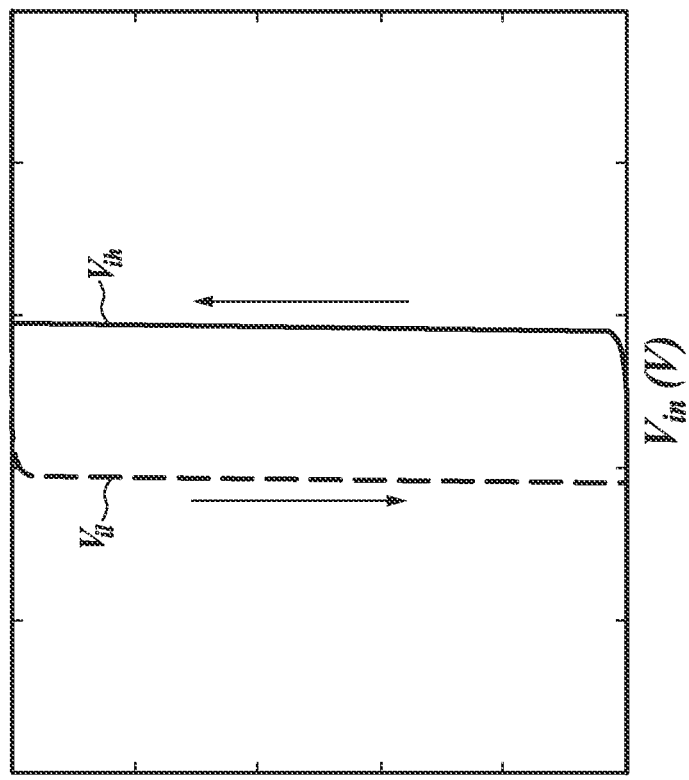
FIGS. 3A and 3B are graphs of outputs of the reference clock input buffer illustrated in FIG. 2.
Figure 3A:
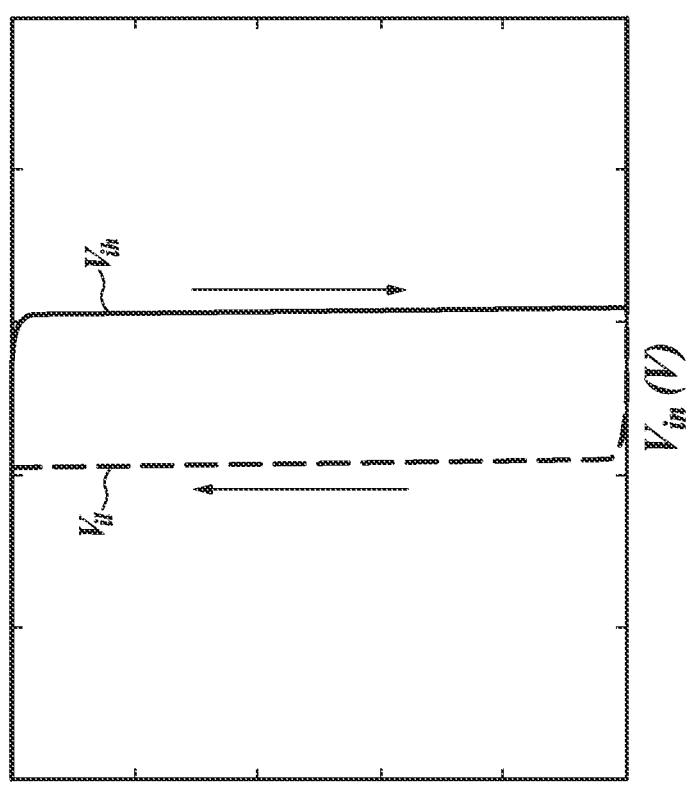

FIG. 3A is a graph of the outputs of reference clock input buffer (Schmitt trigger). The horizontal axis of the graph shows the input voltage Vin, and the vertical axis shows the output voltage Vout. Operation of the Schmitt trigger 20 is characterized by a hysteresis shown as a difference between Vih as the falling edge of the Vout, and Vil as the rising edge of the Vout. In different embodiments, such hysteresis may amount to 400-500 mV, or to other values. For example, in some embodiments the Vil may be about 0.623 V, while the Vih is about 1.136 V. FIG. 3B is an analogous graph of the outputs of Schmitt trigger where the Schmitt trigger includes an additional inverter that inverts the Vout illustrated in FIG. 3A.

Figure 4:
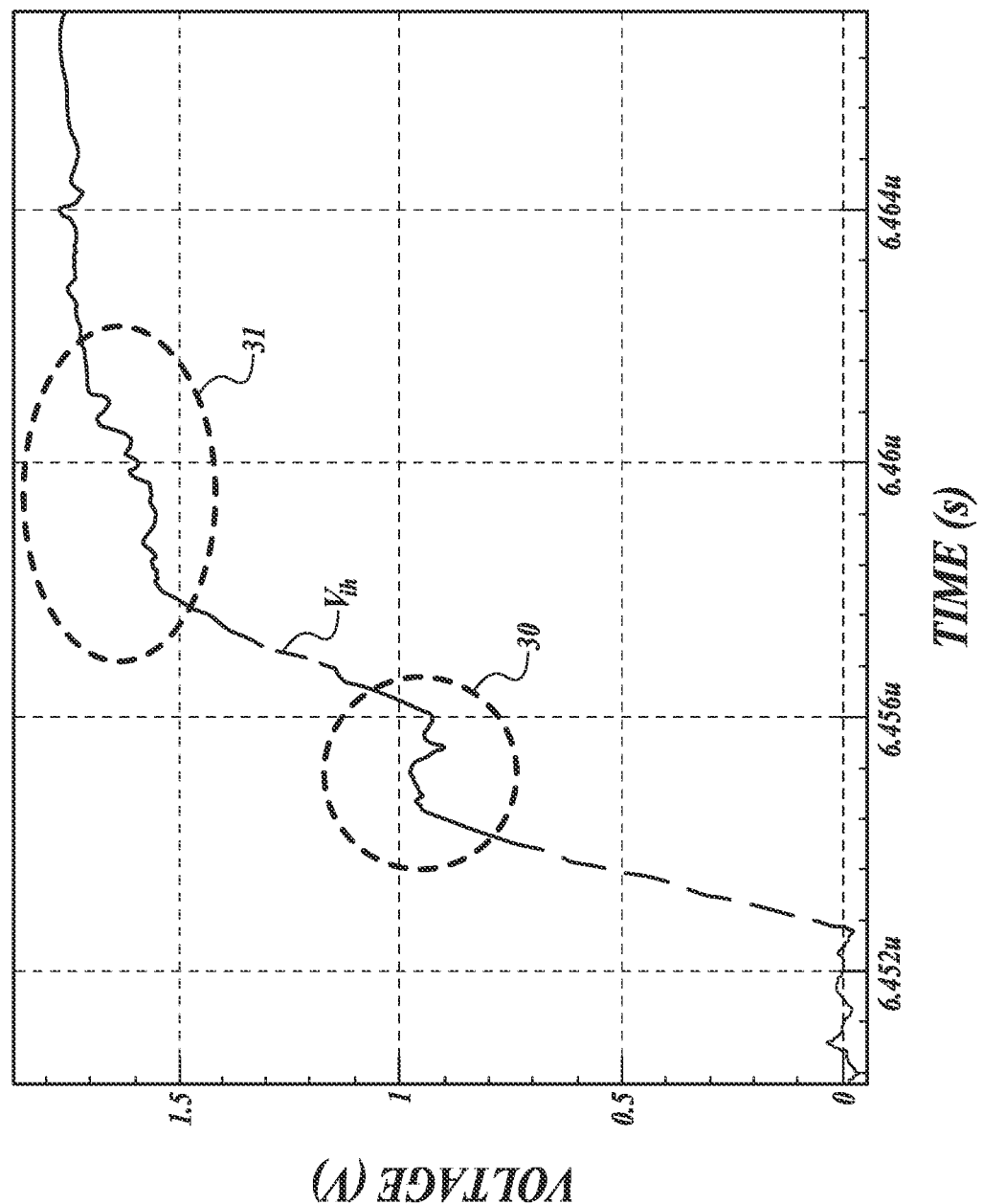
FIG. 4 is a sample graph of voltage ripples in accordance with an embodiment of the present technology.

FIG. 4 is a sample graph of voltage ripples in accordance with an embodiment of the present technology. The horizontal axis shows time in μs, and the vertical axis shows voltage within, for example, relatively long PCB traces or flex cables that transfer signals generated by the pixels of image sensor. The two plateaus 30 and 31 indicate zones of voltage ripples. In the illustrated case, these ripples extend over a period of time of about 2 ns at a voltages of about 0.9 V and 1.6 V. In different embodiments, different values are possible. When, for example, Vih of the reference clock input buffer 20 coincides with a ripple of the illustrated signal, the resulting clock output carries a jitter penalty which may impact image sensor's noise and timing budgets. Therefore, it is generally desirable that the falling edge Vih and/or the rising edge Vil of the reference clock avoid the ripple zones of the voltage signal. However, even when the Vih and/or Vil are established such as to avoid the ripples, in some embodiments the location of the ripple zones or the values of Vih and Vil may change as a function of manufacturing variations, which poses additional problems in designing the reference clock input buffer (e.g., Schmitt trigger). In some embodiments, such differences in Vih that are induced by manufacturing variations may be significant, corresponding to about 300 mV.

Figure 5:
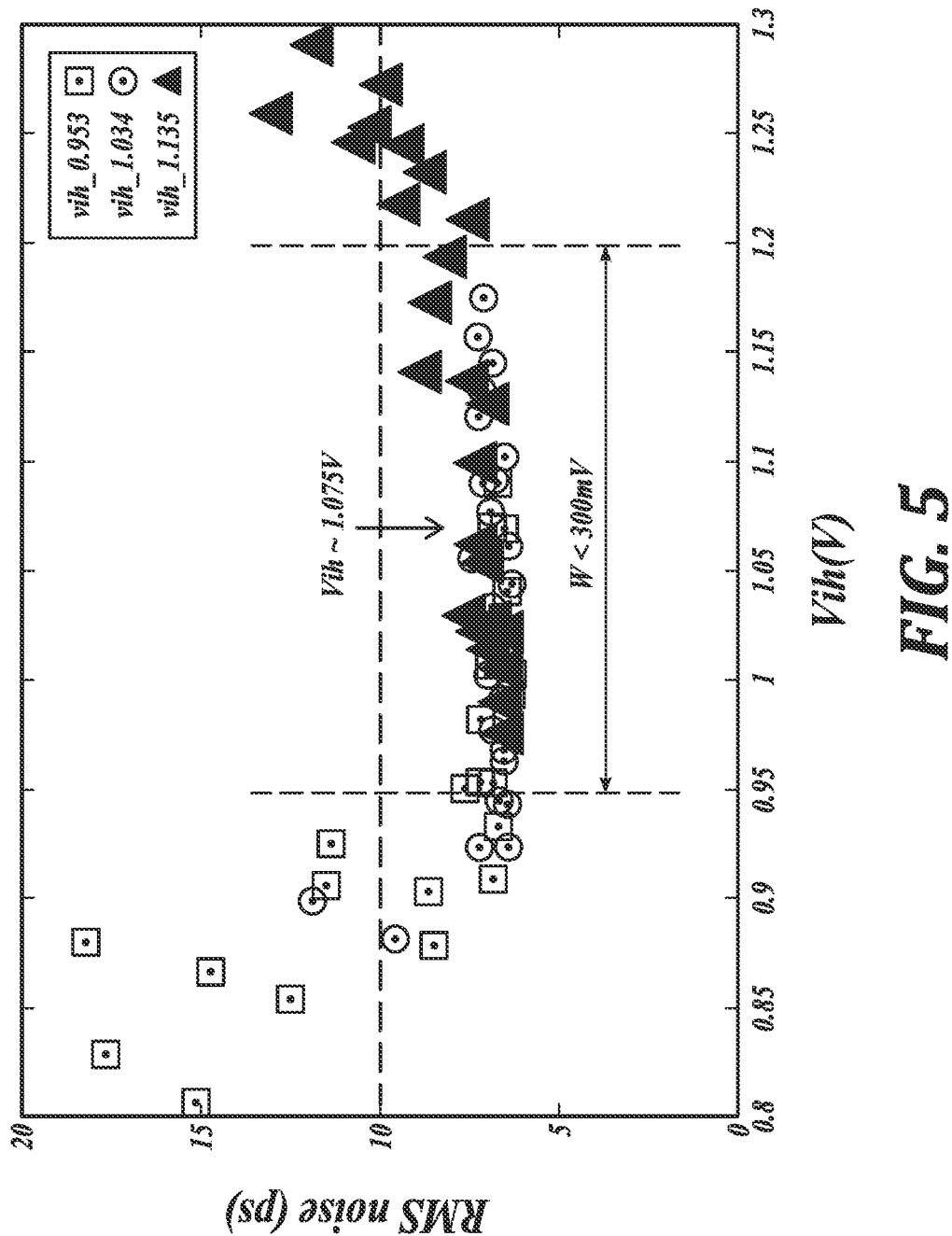
FIG. 5 is a graph of jitter noise in accordance with an embodiment of the present technology.

FIG. 5 is a graph of jitter noise in accordance with an embodiment of the present technology. The horizontal axis shows the Vih voltage of the Schmitt trigger, and the vertical axis shows jitter noise in the acquired voltage signal expressed as a root mean square (RMS) noise. The results are shown for three target Vih values: 0.953 V, 1.034 V, and 1.135 V. However, as explained above, realistic Vih values of a given Schmitt trigger may vary because of, for example, manufacturing variations or other variables. The horizontal dash line indicates a desired limit of the RMS noise of about 10 ps. Based on this desired (target) limit of the RMS noise and target variation W of the Vih at about 300 mV, a target value of the Vih is about 1.075 V in the illustrated example. The above numbers are provided as a non-limiting illustration, and different values may apply in different embodiments.

Figure 6A:
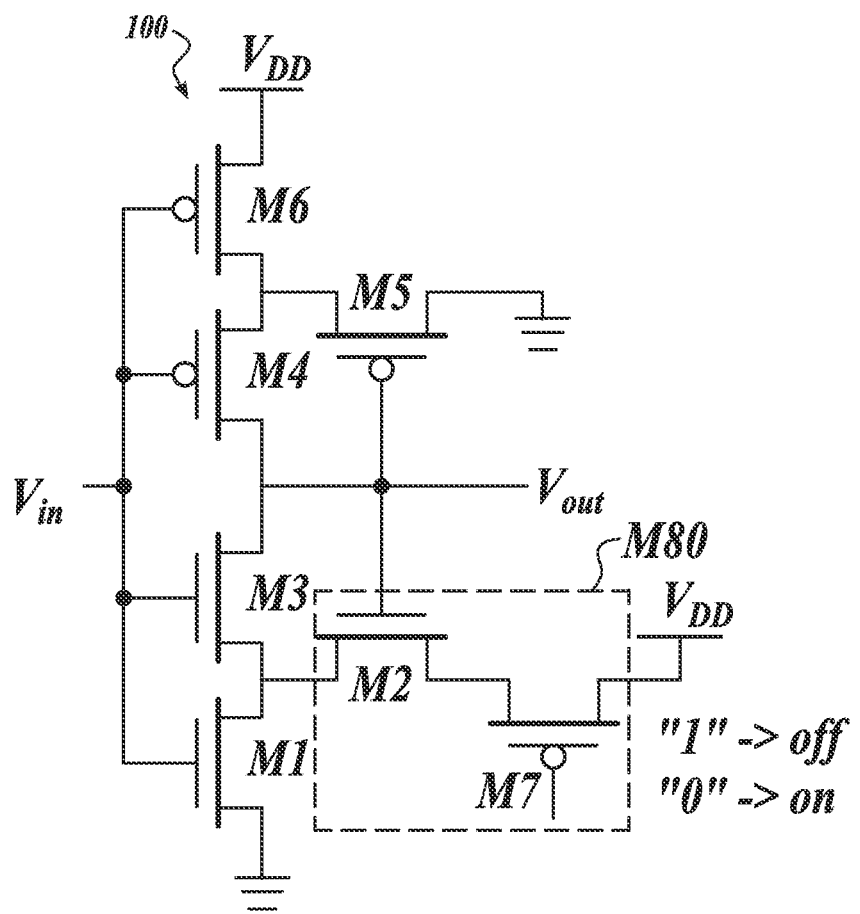
FIGS. 6A and 6B are schematic diagrams of reference clock input buffers in accordance with embodiments of the present technology.
Figure 6B:
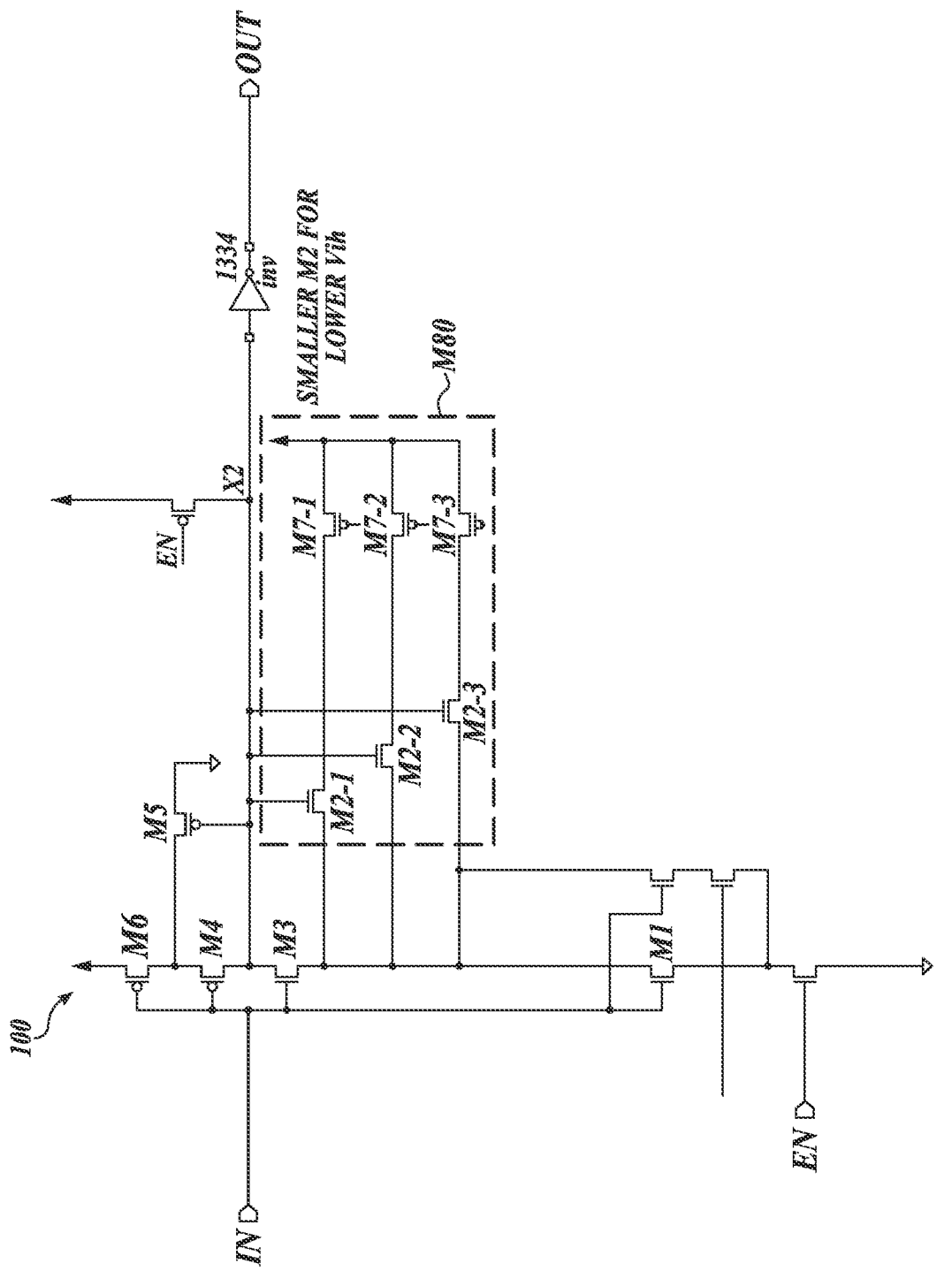

FIGS. 6A and 6B are schematic diagrams of reference clock input buffers 100 (Schmitt triggers) in accordance with embodiments of the present technology. Illustrated Schmitt trigger 100 includes an additional transistor (switch) M7. In the context of this specification, switches M2 are referred to as output switches and switches M7 are referred to as the voltage control switches. In some embodiments, switch M7 may be of a P-channel metal-oxide semiconductor (PMOS) type. In the illustrated embodiment, switch M7 separates switch M2 from the power supply (voltage source) VDD. In some embodiments, the addition of switch M7 improves ESD protection of the Schmitt trigger. Collectively, transistors (switches) M2 and M7 are referred to as the output voltage control array M80. Some embodiments of the circuit M80 are described with reference to FIG. 6B below.

FIG. 6B is a schematic diagram of a reference clock input buffers (Schmitt trigger) in accordance with an embodiment of the present technology. In the illustrated diagram, Schmitt trigger 100 includes a plurality of output switches M2-$i$ and a plurality of voltage control switches M7-$i$. As shown, each N-channel metal-oxide semiconductor (NMOS) transistor M2 (e.g., M2-1, M2-2, M2-3) is connected to VDD through one of P-channel metal-oxide semiconductor (PMOS) transistors M7 (e.g., M7-1, M7-2, M7-3). Therefore, a selected transistor M2-$i$ can be activated and deactivated through its counterpart transistor M7-$i$. It can be shown that the value of Vih changes with different sizes of the transistors M2-$i$, for example with different length L and/or width W. In some embodiments, a smaller size of the transistor M2-$i$ results in a smaller Vih. As a non-limiting example, these differently sized and selectively activated transistors M2-$i$ may produce Vih at 1.135 V, 1.034 V and 0.953 V. In at least some embodiments, the zones of voltage ripples in the sensor signal may be avoided by selecting suitable Vih through an appropriate selection of transistors M2-$i$. As explained above, the electrostatic discharge (ESD) protection of the circuit may also be improved with the addition of serially connected transistor M7-$i$. In some embodiments, the Vil may be adjustable through inter-integrated circuit (I2C) register control and resistor ladder.

Figure 7:
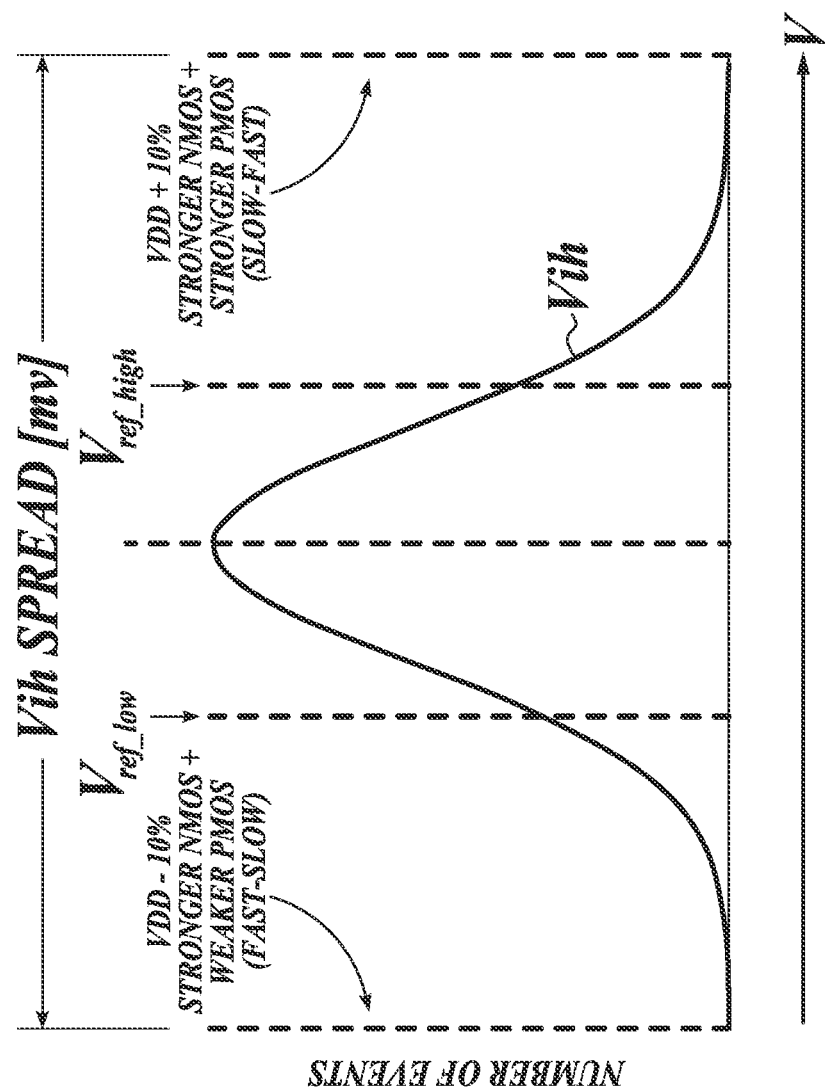
FIG. 7 is a graph of statistical distribution of Vih of a reference clock input buffer in accordance with an embodiment of the present technology.

FIG. 7 is a graph of statistical distribution of Vih of a reference clock input buffer in accordance with an embodiment of the present technology. As explained above, manufacturing variations may cause variations in the Vih/Vil values. An example of such variation in the Vih is illustrated as a Gaussian distribution in the graph. However, changing the Vin value of the Schmitt trigger also changes the Vout value, that is the Vih and Vil values also change as a function of Vin. Therefore, the value of, for example, Vih may be further adjusted by varying Vin value between, for example Vref_low and Vref_high.

Furthermore, variations in VDD track the changes in Vin. For example, for a lower VDD, Vin is also generally lower, everything else being equal.

In some embodiments, varying the Vin between Vref_low and Vref_high threshold can maintain the Vih spread within a certain target range. For example, as discussed with reference to FIG. 5, in a particular embodiment a nominal Vih of 1.075 V is characterized by a possible variation of about 300 mV within which the jitter RMS is still kept below 10 ps. Referring back to FIG. 7, if the total illustrated Vih spread is about 300 mV, then that spread can be further narrowed by selecting the Vin within a range Vref_low to Vref_high. For example, Vref_low and Vref_high may be set at ⅓ and ⅔ of the overall spread of the Vin to capture those cases that are statistically most likely to occur in the real manufacturing process, while reducing the variability in the Vih. Sample circuits that rely on such adjustments of the value of Vin are described with reference to FIGS. 8A and 8B below.

Figure 8A:
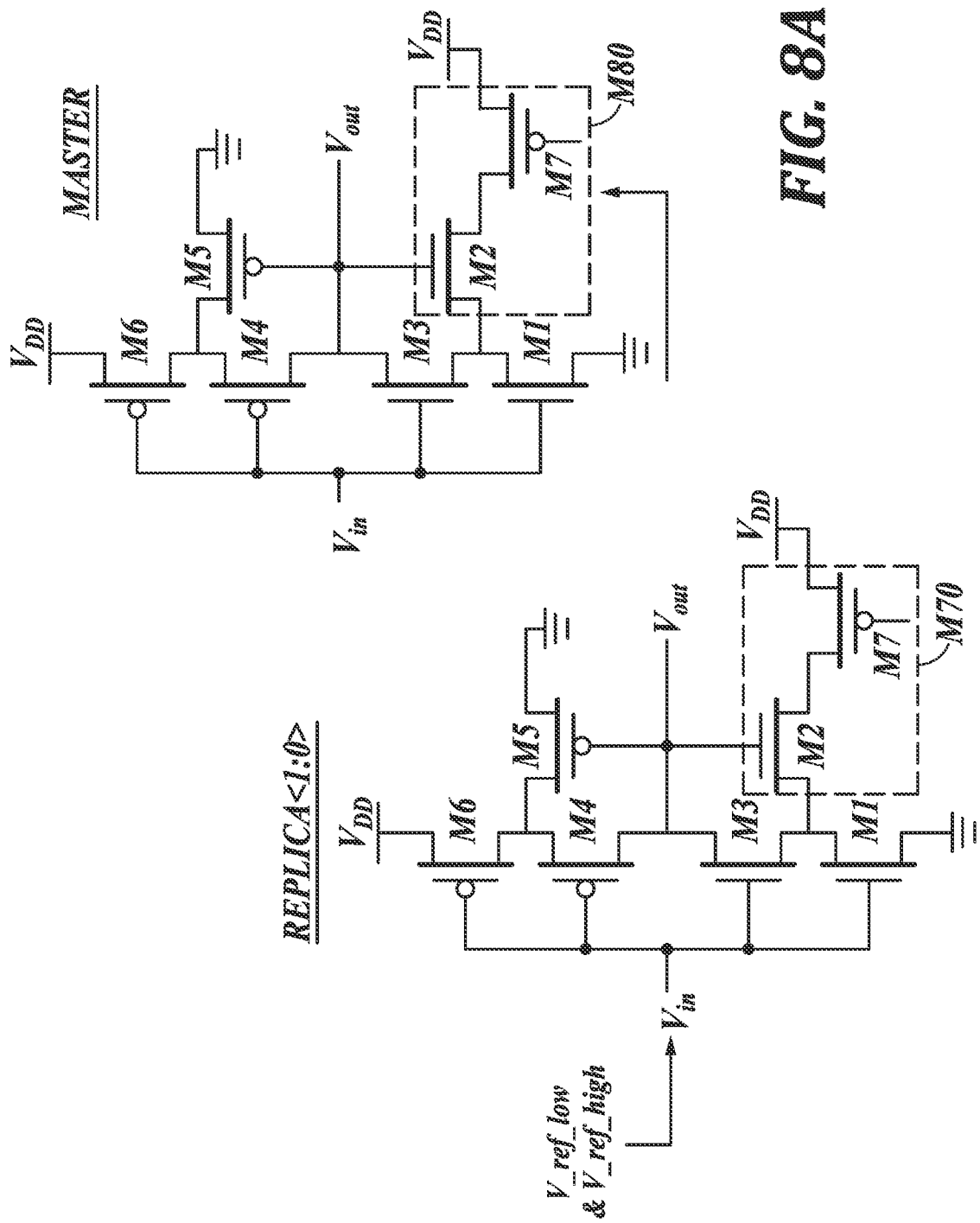
FIG. 8A is a schematic diagram of a reference clock input buffer in accordance with embodiments of the present technology.

FIG. 8A is a schematic diagram of a reference clock input buffer in accordance with embodiments of the present technology. In some embodiments, input voltage range Vref_low to Vref_high may be tested on a Replica circuit that corresponds to a Master circuit. For example, a Replica circuit may be selected from a given manufacturing batch or within a given image sensor.

A possible segregation of the test results with the Replica circuit may proceed as follows. Those Vih values that fall below, for example, mean Vih−100 mV may be tagged under a "11" case (i.e., lower than the lower target boundary and lower than the higher target boundary of the Vih). Analogously, the Vih values that rise above, for example, mean Vih+100 mV may be tagged under a "00" case (i.e., higher than the lower target boundary and higher than the higher target boundary of the Vih). Similarly, the Vih values falling within the target range may be tagged as a "01" case (i.e., higher than the lower target boundary and lower than the higher target boundary of the Vih). A "10" case is not possible (i.e., lower than the lower target boundary and simultaneously higher than the higher target boundary of the Vih). Once the range Vref_low to Vref_high is selected and tested, these values can be transferred to the Vin for a Master (i.e., working, production) circuit. In some embodiments, the Replica circuit may be reused as the Master circuit after fulfilling its calibration function.

Figure 8B:
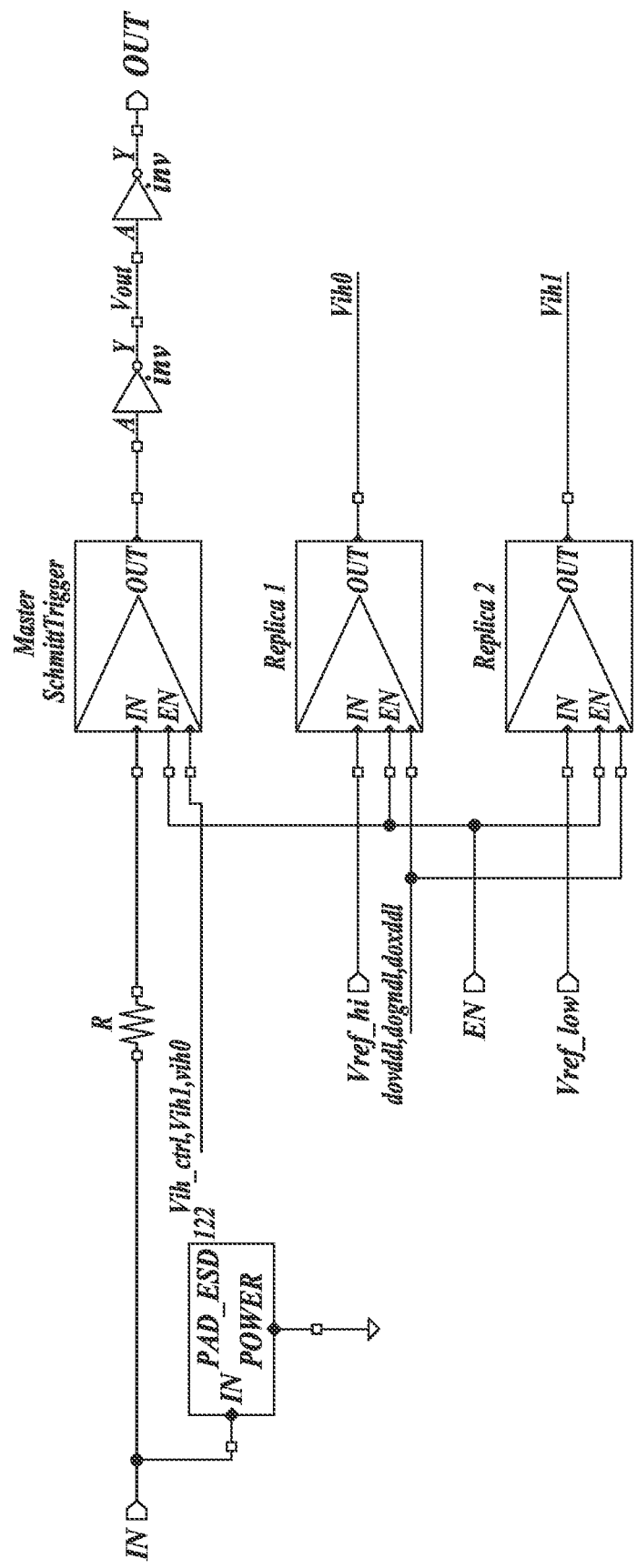
FIG. 8B is a schematic diagram of a reference clock input buffer in accordance with embodiments of the present technology.

FIG. 8B is a schematic diagram of a reference clock input buffer in accordance with embodiments of the present technology. In the illustrated embodiments, separate Schmitt trigger circuits Replica 1 and Replica 2 are used to determine the bounds of Vih based on the variation of Vref_high and Vref_low at the respective inputs of Replica 1 and Replica 2 circuits. Once determined, the values of Vref_high and Vref_low can be transferred as the limits for the input voltage of the Master Schmitt trigger. In some embodiments, the above-described processes of determining the values of Vref_high and Vref_low may be referred to as a process of "calibration" or "trimming."

Figure 9:
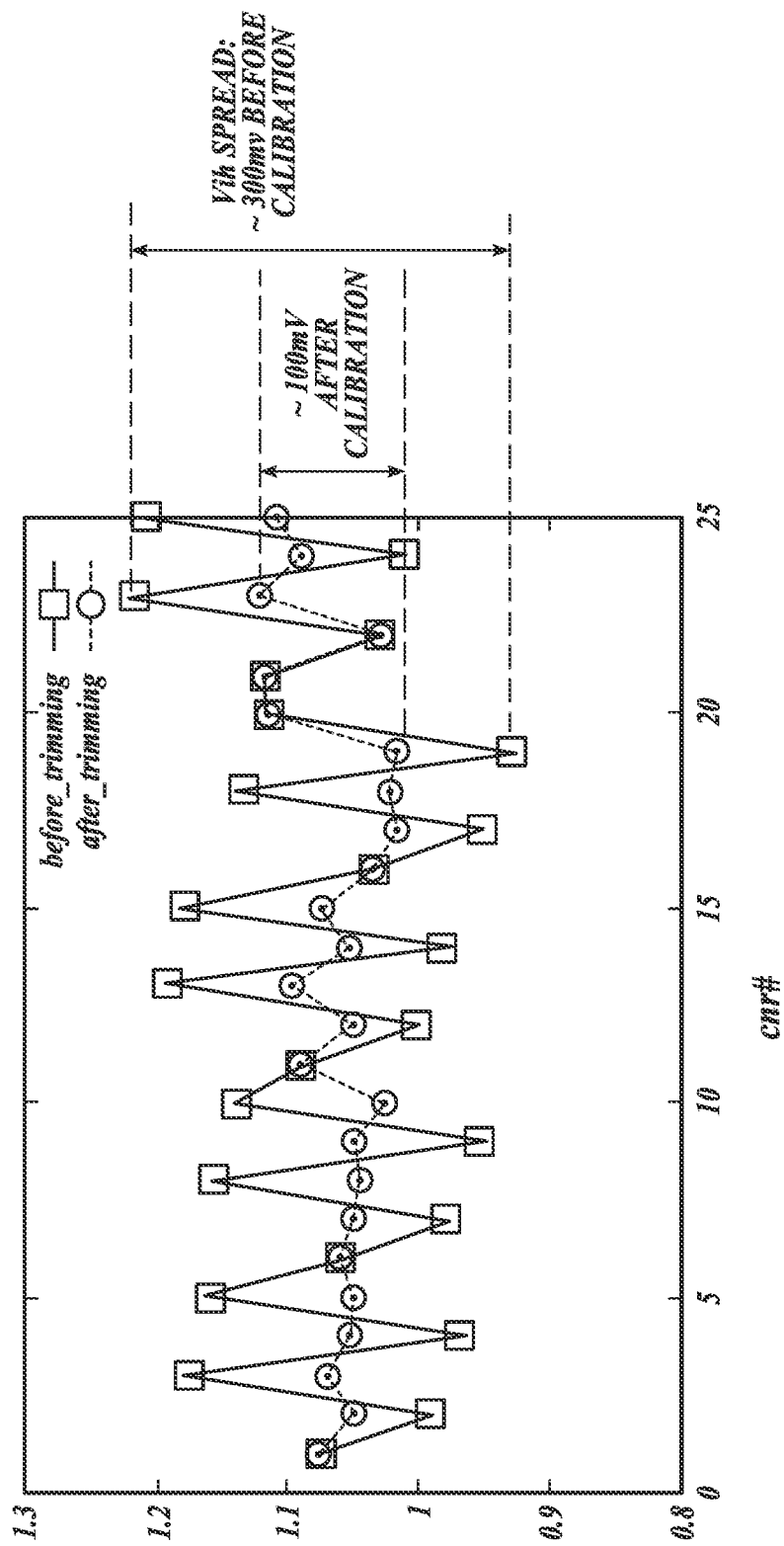
FIG. 9 is a graph of distribution of Vih of a reference clock input buffer in accordance with an embodiment of the present technology.

FIG. 9 is a graph of distribution of Vih of a reference clock input buffer in accordance with an embodiment of the present technology. The results were obtained by Spice simulation. The horizontal axis shows the test case number (e.g., cnr#), and the vertical axis shows distribution of Vih. For the illustrated cases, the Vih before the calibration (i.e., before trimming) is within a band of about 300 mV. After Vin was trimmed to the range of Vref_high and Vref_low, the distribution of Vih is reduced to about 100 mV band. As explained above, a tighter distribution of Vih (or a tighter distribution of Vil) generally produces smaller signal jitter, when all other parameters are kept same.

Figure 10:
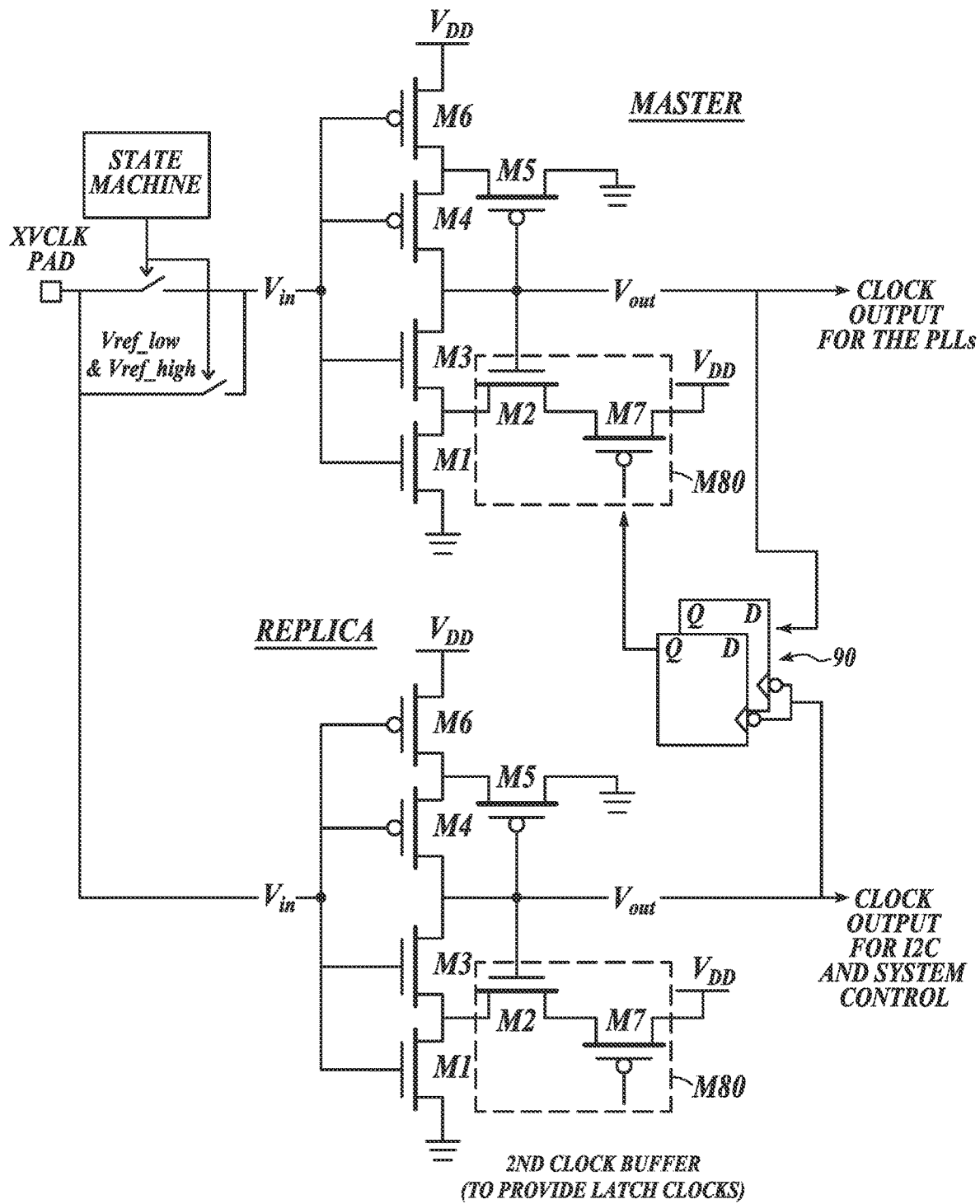
FIG. 10 is a schematic diagram of a reference clock input buffer in accordance with an embodiment of the present technology.

FIG. 10 is a schematic diagram of a reference clock input buffer in accordance with an embodiment of the present technology. The illustrated schematic diagram includes the Replica and Master circuits described above. The Vref_high and Vref_low voltages are provided through a state machine to the Master and Replica Schmitt trigger circuits. Furthermore, to reduce the local mismatch between the Replica and Master, a closed loop cycle is established between the Replica and Master through a latch (e.g., a flip flop circuit) 90. During the calibration phase, latch 90 enables reusing the same Schmitt trigger to generate the control bits ("00", "01", "11") for the normal clock output phase.

In some embodiments, the Vout signals from the Master and Replica Schmitt trigger circuits may be used for different parts of the image sensor. For example, the output of the Master circuit may be used for phase locked loop (PLL) outputs, while the output of the Replica Schmitt trigger may be used for I2C protocols and system control PLL. In practical applications, however, such approach requires more complicated digital control circuits.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A reference clock input buffer of an image sensor, comprising:
 a Schmitt trigger [100] configured to generate a clock signal having a falling edge and a rising edge, wherein the falling edge and the rising edge are separated by a hysteresis voltage, and wherein the Schmitt trigger includes a plurality of output switches [M2-i]; and
 a plurality of voltage control switches [M7-i] individually coupled to individual output switches [M2-i] of the plurality of output switches,
 wherein a voltage (Vih, Vil) of the falling edge signal or the rising edge signal of the Schmitt trigger is adjustable by selectively switching at least one voltage control switch [M7-i] of the plurality of voltage control switches.

2. The reference clock input buffer of claim 1, wherein the output switches [M2-i] are NMOS switches.

3. The reference clock input buffer of claim 2, wherein the voltage control switches [M7-i] are PMOS switches.

4. The reference clock input buffer of claim 3, wherein the voltage control switches [M7-i] are connected to a power supply voltage [VDD].

5. The reference clock input buffer of claim 1, wherein the plurality of voltage control switches includes 3 voltage control switches individually connected to 3 output switches of the plurality of output switches.

6. The reference clock input buffer of claim 5, wherein individual output switches of the plurality of output switches have 3 different sizes.

7. The reference clock input buffer of claim 6, wherein the voltage (Vih) of the rising edge signal of the Schmitt trigger is lowered by selectively switching a smallest output switch of the plurality of output switches to an ON state.

8. The reference clock input buffer of claim 6, wherein the voltage (Vih) of the rising edge signal of the Schmitt trigger is increased by selectively switching a largest output switch of the plurality of output switches to an ON state.

9. The reference clock input buffer of claim 1, wherein the Schmitt trigger is a Master Schmitt trigger, the reference clock input buffer further comprising a Replica Schmitt trigger configured to generate a range of input voltage values [Vref_low, Vref_high] during a calibration phase, wherein the range of input voltage values is configured as an input to the Master Schmitt trigger during an operation phase.

10. The reference clock input buffer of claim 9, wherein the Replica Schmitt trigger and the Master Schmitt trigger are a same Schmitt trigger that operates as the Replica Schmitt trigger in one period of time and as the Master Schmitt trigger in another period of time.

11. The reference clock input buffer of claim 9, further comprising:
a state machine configured to generate the range of input voltage values; and
a latch configured to generate control bits for an output voltage control array.

12. A method of operating a reference clock input buffer of an image sensor, comprising:
generating a clock signal having a falling edge and a rising edge by a Schmitt trigger [100], wherein the falling edge and the rising edge are separated by a hysteresis voltage, and wherein the Schmitt trigger includes a plurality of output switches [M2-*i*]; and
adjusting a voltage (Vih, Vil) of the falling edge signal or the rising edge signal of the Schmitt trigger by selectively switching at least one voltage control switch [M7-*i*] of a plurality of voltage control switches,
wherein individual switches of the plurality of voltage control switches [M7-*i*] are coupled to individual output switches [M2-*i*] of the plurality of output switches.

13. The method of claim 12, wherein the output switches [M2-*i*] are NMOS switches and the voltage control switches [M7-*i*] are PMOS switches.

14. The method of claim 12, wherein the plurality of voltage control switches includes 3 voltage control switches individually connected to 3 output switches of the plurality of output switches.

15. The method of claim 14, wherein individual output switches of the plurality of output switches have 3 different sizes.

16. The method of claim 15, further comprising:
lowering the voltage (Vih) of the rising edge signal of the Schmitt trigger by selectively switching a smallest output switch of the plurality of output switches to an ON state.

17. The method of claim 15, further comprising:
increasing the voltage (Vih) of the rising edge signal of the Schmitt trigger by selectively switching a largest output switch of the plurality of output switches to an ON state.

18. The method of claim 12, wherein the Schmitt trigger is a Master Schmitt trigger, the method further comprising:
during a calibration phase, generating a range of input voltage values [Vref_low, Vref_high] by a Replica Schmitt trigger of the reference clock input buffer; and
during an operation phase, operating the Master Schmitt trigger using the range of input voltage values as an input to the Master Schmitt trigger.

19. The method of claim 18, wherein the Replica Schmitt trigger and the Master Schmitt trigger are a same Schmitt trigger configured to operate as the Replica Schmitt trigger during the calibration phase and configured to operate as the Master Schmitt trigger during the operation phase.

20. The method of claim 18, further comprising:
generating the range of input voltage values by a state machine; and
generating control bits for an output voltage control array by a latch configured to receive an input from the Replica Schmitt trigger and to provide an output to the Master Schmitt trigger.

* * * * *